United States Patent
Hulub et al.

(10) Patent No.: US 9,761,284 B1
(45) Date of Patent: Sep. 12, 2017

(54) CURRENT STARVED VOLTAGE COMPARATOR AND SELECTOR

(71) Applicant: Intel Corporation, Santa Clara, CA (US)

(72) Inventors: Marian Hulub, Unterhaching (DE); Roland Heymann, Sauerlach (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/199,578

(22) Filed: Jun. 30, 2016

(51) Int. Cl.
| | |
|---|---|
| G11C 7/06 | (2006.01) |
| H03F 3/45 | (2006.01) |
| H03K 5/24 | (2006.01) |
| H03K 17/687 | (2006.01) |
| G11C 7/10 | (2006.01) |

(52) U.S. Cl.
CPC ............ *G11C 7/062* (2013.01); *G11C 7/1006* (2013.01); *H03F 3/45475* (2013.01); *H03K 5/24* (2013.01); *H03K 17/687* (2013.01); *H03F 2203/45288* (2013.01)

(58) Field of Classification Search
CPC ......... G11C 7/62; G11C 7/1006; H03F 3/454; H03F 3/75; H03K 5/24; H03K 17/687
See application file for complete search history.

(56) References Cited

U.S. PATENT DOCUMENTS

| | | | | |
|---|---|---|---|---|
| 7,257,029 B2* | 8/2007 | Hung | .................. | G11C 16/12 365/185.05 |
| 7,773,428 B2* | 8/2010 | Ando | ................. | G11C 16/0416 365/185.1 |
| 8,025,373 B2* | 9/2011 | Sugahara | ................. | B41J 2/175 347/84 |
| 8,331,159 B2* | 12/2012 | Nakagaki | ........... | G11C 16/0408 365/185.01 |

* cited by examiner

*Primary Examiner* — Pho M Luu
(74) *Attorney, Agent, or Firm* — Green, Howard & Mughal LLP

(57) ABSTRACT

An apparatus is provided which comprises: a bi-directional switch; and a comparator coupled to the bi-directional switch, the comparator having: a first input coupled to a first terminal of the bi-directional switch; a second input coupled to a second terminal of the bi-directional switch; and an output coupled to a body or substrate of the bi-directional switch.

22 Claims, 5 Drawing Sheets

CURRENT STARVED VOLTAGE COMPARATOR AND SELECTOR

BACKGROUND

In low voltage technologies, power distribution may require selecting between multiple supply inputs and delivering just one supply depending on some digital programming or voltage levels. A device such as a bi-directional switch that can have either a high voltage or a low voltage as possible voltages on its drain/source terminals may cause channel conduction as well as parasitic body diode (drain-bulk or source-bulk) when the body or substrate is not tied to the highest possible voltage (relative to the voltages on the source and drain terminals).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
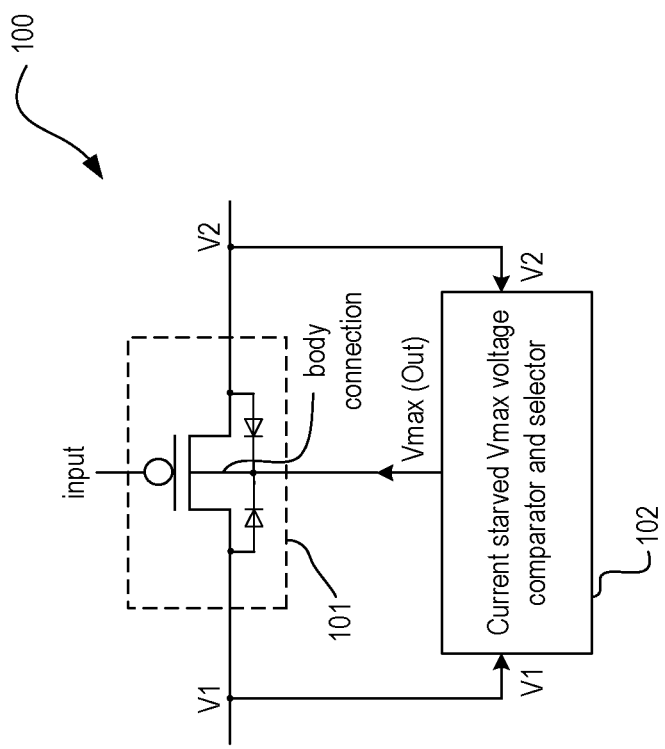
FIG. 1 illustrates an apparatus with a current starved Vmax voltage comparator and selector to control body/substrate of a device, according to some embodiments of the disclosure.

Some embodiments describe an apparatus comprising: a bi-directional switch; and a comparator coupled to the bi-directional switch. In some embodiments, the comparator includes: a first input coupled to a first terminal of the bi-directional switch; a second input coupled to a second terminal of the bi-directional switch; and an output coupled to a body or substrate of the bi-directional switch. In some embodiments, the bi-directional switch is a p-type transistor. In some embodiments, the comparator is to determine whether a first voltage on the first input and a second voltage on the second input are different, and to provide a body voltage to the body or substrate of the bi-directional switch according to a larger of the first or second voltages.

Some embodiments describe a comparator (or sensor) that compares two inputs (e.g., source and drain terminals of a common gate stage) and adds a positive loop to boost the bandwidth of an Operational Transconductance Amplifier (OTA). As such, high bandwidth is achieved when there is a difference between one of the inputs and a maximum of the two inputs is derived as Vmax voltage with low power circuits.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices. The term "coupled" means either a direct electrical, mechanical, or magnetic connection between the things that are connected or an indirect connection through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% (unless otherwise specified) of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

For purposes of the embodiments, the transistors in various circuits, modules, and logic blocks are metal oxide semiconductor (MOS) transistors, which include drain, source, gate, and bulk terminals. The transistors also include Tri-Gate and FinFET transistors, Gate All Around Cylindrical Transistors, Tunneling FET (TFET), Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure.

FIG. 1 illustrates apparatus 100 with a current starved Vmax voltage comparator and selector to control a body/substrate of a device, according to some embodiments of the disclosure. In some embodiments, apparatus 100 comprises a bi-directional switch 101 and current starved Vmax voltage comparator and selector (referred to as comparator or sensor 102). In some embodiments, bi-directional switch 101 is a common gate stage of a circuit. The bi-direction switch 100 has at least four terminals—gate terminal tied to input, drain/source terminal V1, the source/drain terminal V2, and body/substrate terminal or connection. Here, signal names and node names are interchangeably used. For example, the term "V1" may refer to node V1 or voltage V1 on that node depending on the context of the sentence.

In various embodiments, bi-directional switch 101 comprises at least one p-type device. When a p-type device is used for forming bi-directional switch 101, isolation is needed because the voltages on the source/drain and body may be such to cause channel conduction as well as conduction through parasitic body diode(s) (e.g., drain-body or source-body). In some embodiments, to prevent reverse conduction (through body), the maximum voltage at the terminals of bi-directional switch 101 is detected, and that maximum voltage is then used for turning bi-directional switch 101 off when the input is of the same voltage level (i.e., maximum voltage level). In some embodiments, the maximum voltage is detected by comparator 102 which compares the voltages on nodes V1 and V2, and selects the larger of the two voltages as Vmax (Out) to the body (substrate or bulk) terminal of bi-directional switch 101.

In some embodiments, comparator 102 (or sensor) compares two inputs—V1 and V2 (e.g., source and drain terminals of a common gate stage)—and adds a positive loop to boost the bandwidth of an Operational Transconductance Amplifier (OTA) in comparator 102. As such, high bandwidth is achieved when there is a difference between one of the inputs and a maximum of the two inputs is derived as Vmax voltage with low power circuits.

Figure 2:
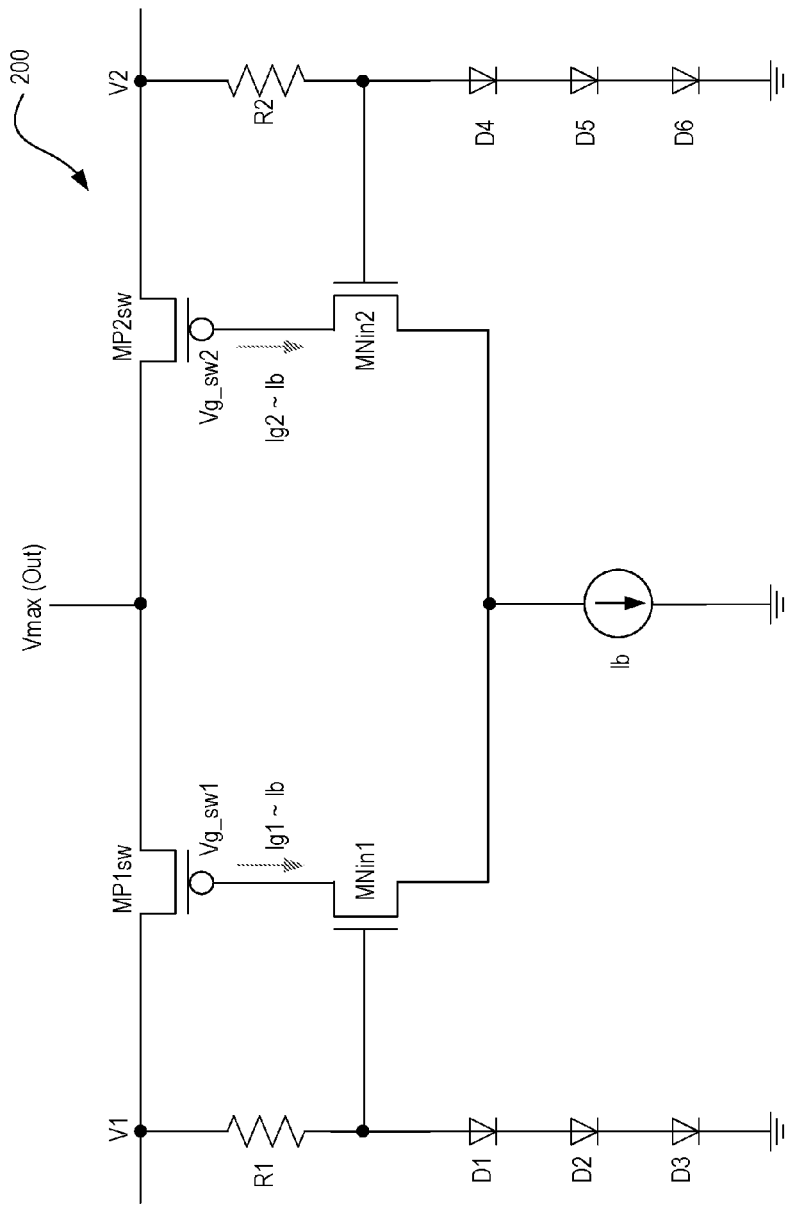
FIG. 2 illustrates an apparatus for comparing two voltages and providing a maximum of the two voltages.

FIG. 2 illustrates apparatus 200 for comparing two voltages and providing a maximum of the two voltages. Apparatus 200 is a possible example of a comparator for comparing two voltages and a selector of one the larger of the two voltages. Apparatus 200 includes p-type transistor switches MP1*sw* and MP2*sw*, resistors R1 and R2, diodes D1, D2, D3, D4, D5, and D6, current source Ib, and n-type transistors MNin1 and MNin2 coupled together as shown.

Here, resistor divider R1 and diodes D1-D3 divide down the input V1 and provide that divided down voltage to transistor MNin1 (an OTA) that drives the gate (Vg_sw1) of transistor MP1*sw*. The current through transistor MNin1 is Ig1 which is approximately equal to Ib (provided by current source Ib). Resistor divider R2 and diodes D4-D6 divide down the input V2 and provide that divided down voltage to transistor MNin2 (another OTA) that drives the gate of transistor MP2*sw*. The current through transistor MNin2 is Ig2 which is approximately equal to Ib (provided by current source Ib). As such, transistors MP1*sw* and/or MP2*sw* is selected to provide Vmax (which is the larger of the voltages V1 and V2). The current Ib ensures start-up of apparatus 200. In some cases, current Ib is tens of nA (nano Amperes) and is provided by a current source implemented as very large resistors.

Apparatus 200 may suffer from several disadvantages. For example, the bandwidth of apparatus 200 is limited and low because of the hundreds of nA (nano-Amperes) driving current Ib. Here, bandwidth refers to how quickly a compactor determines which of the two voltages V1 and V2 is larger, and then provide the larger of the two as Vmax. Apparatus 200 may also depend on internal biasing currents and on internal supply voltages. Alternate solutions to apparatus 200 may load additional circuitry (e.g., different internal bias or supply currents) on the node Vmax. As such, transistors MP1*sw* and MP2*sw* have to be made larger in size to overcome the additional load added on Vmax. The additional load leads to even smaller bandwidth and inherently big shoot-through currents when Vmax is switching from one input (e.g., V1) to another input (e.g., V2).

For cases where transistors MP1*s*1 and MP2*sw* are made larger, shoot-through currents through nodes V1 and V2 to Vmax increase. In some cases, one of the inputs V1 and V2 may even latch to Vmax node due to the shoot-through current when pull down capability is limited (e.g., when the gates of transistors MNin1 and/or MNin2 are programmed by the resistor divider to a lower voltage than the unused inputs V1 or V2). For instance, in the no load condition on one of the nodes V1 or V2, the output Vmax may be latched at the unused voltage input value.

Figure 3:
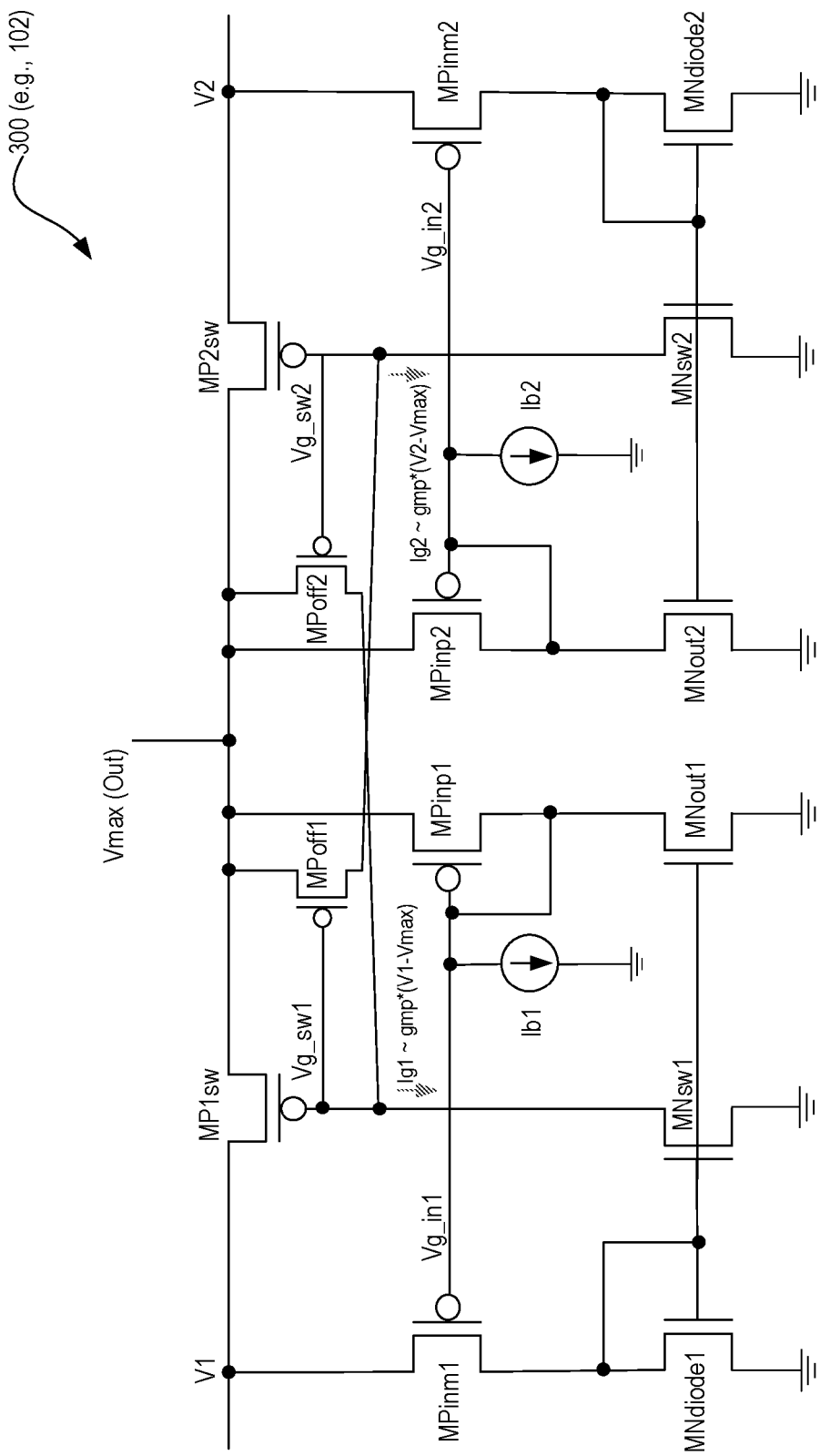
FIG. 3 illustrates an apparatus with a current starved Vmax voltage comparator and selector to control the body/substrate of a device, according to some embodiments of the disclosure.

FIG. 3 illustrates apparatus 300/102 with a current starved Vmax voltage comparator and selector to control body/substrate of a device, according to some embodiments of the disclosure. In some embodiments, apparatus 300 comprises p-type transistors MP1*sw*, MP2*sw*, MPoff1, MPoff2, MPinm1, MPinm2, MPinp1, MPinp2, and n-type transistors MNdiode1, MNdiode2, MNsw1, MNsw2, MNout1, and MNout2, and current sources Ib1 and Ib2 coupled together as shown.

In some embodiments, one of transistors MP1*sw* and MP2*sw* is turned on to select one of the larger of V1 or V2 as output Vmax. In some embodiments, transistors MPoff1 and MPoff2 are used to fully turn off one of the unselected transistors MP1*sw* and MP2*sw*. For example, when transistor MP1*sw* is to be turned off, transistor MPoff2 further raises the gate voltage of Vg_sw1 to turn off MP1*sw*. Likewise, when transistor MP2*sw* is to be turned off, transistor MPoff1 further raises the gate voltage of Vg_sw2 to turn off MP2*sw*.

In some embodiments, transistors MPinm1, MPinp1, MNdiode1, MNsw1, and MNout1 together form a first OTA, where Vg_in1 is set by current source Ib1. In some embodiments, transistors MPinm2, MPinp2, MNdiode2, MNsw2, and MNout2 together form a second OTA, wherein Vg_in2 is set by current source Ib2.

Compared to the fixed currents Ib1 and Ib2 through transistors MNin1 and MNin2 of FIG. 2, respectively, that cause one of the switches MP1*sw* or MP2*sw* to be turned on, the current available to discharge in apparatus 300 to turn on the gates of the pass device or transistor MP1*sw*/MP2*sw* to select the desired voltage (V1 or V2) is dependent on the voltage difference between V1 (or V2) and Vmax. As such, a larger bandwidth (compared to apparatus 200 of FIG. 2) is achieved with low quiescent current. Here, gain is also boosted by biasing the first and second OTAs with a fraction of the derived current.

Apparatus 300 is described with reference to the bi-directional switch 101, where V1 and V2 are in/out voltages that may be swapped/controlled from external means (e.g., battery, power regulator, etc.) when bi-directional switch 101 is non-conducting (i.e., turned OFF (e.g., when input is same as Vmax)). In such a case, to ensure isolation, the gate and bulk terminals of bi-directional switch 101 should be connected to the highest supply out of V1 and V2 (e.g., Vmax, which is the larger of V1 or V2 voltages). In some embodiments, to achieve the above function, first and second OTAs are added, one for each input voltage, continuously comparing the Vmax voltage and their respective Vin (i.e., V1 or V2) voltage.

In some embodiments, input pair transistors MPinm1 and MPinp1 of the first OTA convert the voltage difference between Vmax and V1 into current Ig1 by the transconductance gm of transistor MPinm1 (i.e., gmp). In some embodiments, transistor MPinp1 is diode-connected. With reference to the first OTA, in some embodiments, current Ig1 is then fed back into the transistor Mpinp1 by a smaller ratio with transistors MNdiode1 and MNNout1, thus boosting the gain of the first OTA. Also the same current is mirrored and used to pull down the gate Vg_sw1 of transistor MP1sw, according to some embodiments. In some embodiments, whenever the voltage difference is higher between Vmax and V1, the transistor MP1sw wins (i.e., turns on) and turns off the transistor MP2sw by means of MPoff1. Here, the current Ig1 is approximately equal to gmp*(V1−Vmax), which relies on a difference in voltages. As such, as the difference between V1 and Vmax is large, apparatus 300 exhibits higher speed than apparatus 200 to complete the comparison and detection functions.

In some embodiments, input pair transistors MPinm2 and MPinp2 of the second OTA convert the voltage difference between Vmax and V2 into current Ig2 by the transconductance gm of transistor MPinm2. In some embodiments, transistor MPinp2 is diode-connected. With reference to the second OTA, in some embodiments, current Ig2 is fed back into the transistor MPinp2 by a smaller ratio with transistors MNdiode2 and MNNout2, thus boosting the gain of the second OTA. Also the same current is mirrored and used to pull down the gate Vg_sw2 of transistor MP2sw, according to some embodiments. In some embodiments, whenever the voltage difference is higher between Vmax and V2, the transistor MP2sw wins (e.g., turns on) and turns off the transistor MP1sw by means of MPoff2. Here, the current Ig2 is approximately equal to gmp*(V2−Vmax), which relies on a difference in voltages (where gmp is the transconductance of a p-type device). As such, as the difference between V2 and Vmax is large, apparatus 300 exhibits higher speed than apparatus 200 to complete the comparison and detection functions.

In some embodiments, the bias currents Ib1 and Ib2 of apparatus 300 are much smaller than the bias currents of apparatus 200. In some embodiments, the bias currents Ib1 and Ib2 of apparatus 300 are generated by resistor dividers. One purpose of having the bias currents is to ensure start-up by appropriately biasing nodes Vg_in1 and Vd_in2.

Figure 4:
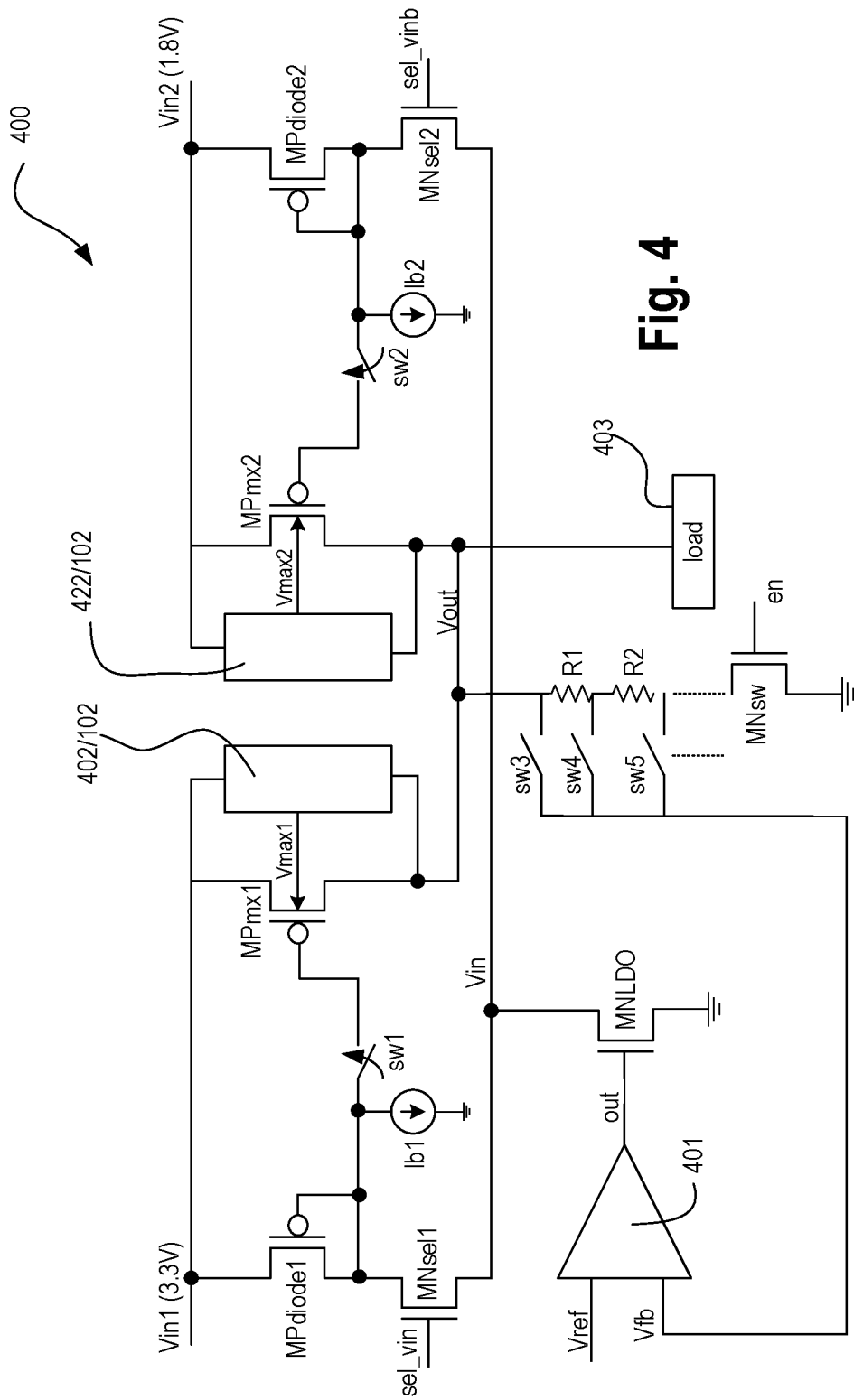
FIG. 4 illustrates a multiple-input Low Drop-out (LDO) regulator with apparatus with a current starved Vmax voltage comparator and selector to control body/substrate of a device, according to some embodiments of the disclosure.

FIG. 4 illustrates a multiple-input Low Drop-out (LDO) regulator 400 with apparatus with a current starved Vmax voltage comparator and selector to control body/substrate of a device, according to some embodiments of the disclosure. It is pointed out that those elements of FIG. 4 having the same reference numbers (or names) as the elements of any other figure can operate or function in any manner similar to that described, but are not limited to such.

In some embodiments, LDO regulator 400 comprises comparator or amplifier 401, current starved Vmax voltage comparator and selectors 402/102 and 422/102, first supply input Vin1 (e.g., 3.3V), second supply input Vin2 (e.g., 1.8V), n-type select transistors MNsel1 and MNsel2 to provide Vin from either the first supply input Vin1 or the second supply input Vin2 to n-type transistor MNLDO driven by comparator 401.

LDO regulator 400 compares feedback voltage (Vfb) with a reference voltage (Vref) and controls the output (out) to control current flow in transistor MNLDO such that Vref and Vfb become substantially equal. In some embodiments, Vin is selected between one of Vin1 or Vin2, where Vin1 is much higher than Vin2 (e.g., 3.3V>1.8V). As such, a multi-input LDO function is achieved. In some embodiments, Vout is provided by set of transistors MPdiode1, MPmx1, switch (sw1), bias current source Ib1, or by set of transistors MPdiode2, MPmx2, switch (sw2), bias current source Ib2 depending on whether MNsel1 is enabled (i.e., selected) or MNsel2 is enabled (or selected). Here, select signal sel_vinb is inverse or complementary of select signal sel_vinb. To avoid the possibility of body/substrate conduction through MPmx1 and MPmx2, current starved Vmax voltage comparator and selectors 402/102 and 422/102 are provided. In some embodiments, current starved Vmax voltage comparator and selector 402 is same as current starved Vmax voltage comparator and selector 300, and current starved Vmax voltage comparator and selector 422 is same as current starved Vmax voltage comparator and selector 300.

In some embodiments, current starved Vmax voltage comparator and selector 402/102 is used to determine the larger of Vout and Vin1, and provide that larger voltage as Vmax1 to the body of transistor MPmx1. In some embodiments, current starved Vmax voltage comparator and selector 422/102 is used to determine the larger of Vout and Vin2, and provide that larger voltage as Vmax2 to the body of transistor MPmx2. Here, Vout is the regulated output voltage which is provided to load 403. Load 403 can be any load (e.g., a logic section of a processor, a processor core, cache, input-output peripheral circuit, etc.).

In some embodiments, Vfb is selected by one of the switches sw3, sw4, sw5, etc. via a resistor ladder (e.g., a ladder formed of resistors R1, R2, etc.). The resistor ladder divides down the voltage of Vout and provides it as Vfb. In some embodiments, n-type transistor MNsw is provided to enable or disable the regulation function of LDO regulator 400.

While the embodiment of FIG. 4 illustrates one example where current starved Vmax voltage comparator and selector 300/200 can be used (as comparators 401/422), the embodiments are not limited to this application. Any circuit using a p-type device as a bi-directional device where the source and drain terminals can have substantially different voltages can use comparator 300/200 to provide the correct biasing (e.g., the larger of the different voltages) for the body/substrate/bulk of the p-type device.

Figure 5:
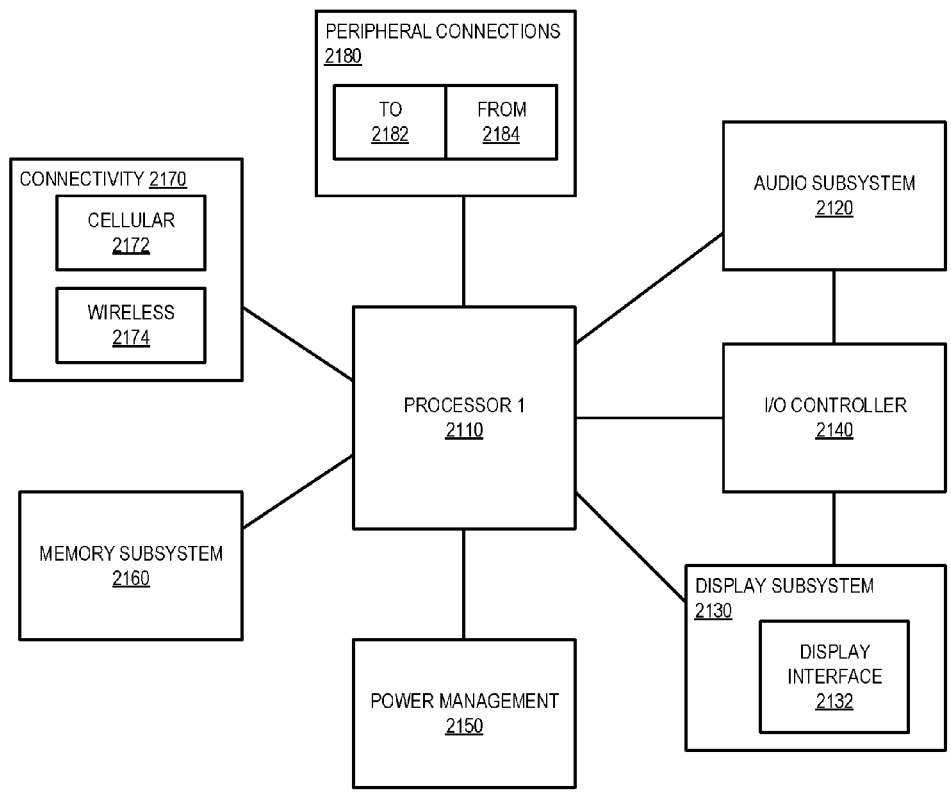
FIG. 5 illustrates a smart device or a computer system or a SoC (System-on-Chip) with an apparatus with a current starved Vmax voltage comparator and selector to control body/substrate of a device, according to some embodiments.

FIG. 5 illustrates a smart device or a computer system or a SoC (System-on-Chip) 2100 with an apparatus with a current starved Vmax voltage comparator and selector 300 to control body/substrate of a device, according to some embodiments. It is pointed out that those elements of FIG. 5 having the same reference numbers (or names) as the elements of any other figure can operate or function in any manner similar to that described, but are not limited to such.

FIG. 5 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 with an apparatus with a current starved Vmax voltage comparator and selector 300 to control body/substrate of a device, according to some embodiments discussed. Other blocks of the computing device 2100 may also include an apparatus with a current starved Vmax voltage comparator and selector 300 to control body/substrate of a device, according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, Peripheral connections 2180 include hardware interfaces and connectors, as well as software components (e.g., drivers, protocol stacks) to make peripheral connections. It will be understood that the computing device 2100 could be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a body or substrate of a p-type transistor, the p-type transistor having a source terminal and a drain terminal which are to receive a source voltage and a drain voltage, respectively; and a sensor coupled to the source and drain terminals of the p-type transistor, wherein the sensor is to determine whether the source voltage and the drain voltage are different, and to provide a body voltage to the body or substrate of the p-type transistor according to a larger of the source or drain voltages. In some embodiments, the sensor has a bandwidth which is proportional to a difference between the source and drain voltages.

In some embodiments, the sensor comprises: a first switch coupled to the source terminal of the p-type transistor; and a second switch coupled in series with the first switch via a common node, wherein the second switch is coupled to the drain terminal of the p-type transistor, wherein the common node is coupled to the body or substrate of the p-type transistor. In some embodiments, the sensor comprises a first device coupled to the common node and a gate terminal of the second switch, and wherein the first device has a gate terminal coupled to a gate terminal of the first switch. In some embodiments, the sensor comprises a second device coupled to the common node and a gate terminal of the first switch, and wherein the second device has a gate terminal coupled to a gate terminal of the second switch. In some embodiments, the sensor comprises a first operational transconductance amplifier (OTA) coupled to the source terminal of the p-type transistor. In some embodiments, the sensor comprises a second OTA coupled to the drain terminal of the drain terminal of the p-type transistor. In some embodiments, the p-type transistor is a bi-directional switch.

In another example, an apparatus is provided which comprises: a bi-directional switch; and a comparator coupled to the bi-directional switch, the comparator having: a first input coupled to a first terminal of the bi-directional switch; a second input coupled to a second terminal of the bi-directional switch; and an output coupled to a body or substrate of the bi-directional switch. In some embodiments, the comparator has a bandwidth which is proportional to a difference between a voltage on the first input and a voltage on the second input. In some embodiments, the bi-directional switch is a p-type transistor. In some embodiments, the comparator is to determine whether a first voltage on the first input and a second voltage on the second input are different, and to provide a body voltage to the body or substrate of the bi-directional switch according to a larger of the first or second voltages.

In some embodiments, the comparator comprises: a first switch coupled to the first terminal of the bi-directional switch; and a second switch coupled in series with the first switch via a common node, wherein the second switch is coupled to the second terminal of the bi-directional switch, wherein the common node is coupled to the body or substrate of the bi-directional switch. In some embodiments, the comparator comprises a first device coupled to the common node and a gate terminal of the second switch, and wherein the first device has a gate terminal coupled to a gate terminal of the first switch. In some embodiments, the comparator comprises a second device coupled to the common node and a gate terminal of the first switch, and wherein the second device has a gate terminal coupled to a gate terminal of the second switch. In some embodiments, the comparator comprises a first operational transconductance amplifier (OTA)

coupled to the source terminal of the p-type transistor. In some embodiments, the comparator comprises a second OTA coupled to the drain terminal of the drain terminal of the p-type transistor.

In some embodiments, a system is provided which comprises: a memory; a processor coupled to the memory, the processor comprising: a bi-directional switch; and a comparator coupled to the bi-directional switch, the comparator having: a first input coupled to a first terminal of the bi-directional switch; a second input coupled to a second terminal of the bi-directional switch; and an output coupled to a body or substrate of the bi-directional switch, wherein the comparator has a bandwidth which is proportional to a difference between a voltage on the first input and a voltage on the second input; and a wireless interface for allowing the processor to communicate with another device.

In some embodiments, the comparator is to determine whether a first voltage on the first input and a second voltage on the second input are different, and to provide a body voltage to the body or substrate of the bi-directional switch according to a larger of the first or second voltages. In some embodiments, the comparator comprises: a first switch coupled to the first terminal of the bi-directional switch; and a second switch coupled in series with the first switch via a common node, wherein the second switch is coupled to the second terminal of the -directional switch, and wherein the common node is coupled to the body or substrate of the -directional switch. In some embodiments, the comparator comprises: a first device coupled to the common node and a gate terminal of the second switch, and wherein the first device has a gate terminal coupled to a gate terminal of the first switch; and a second device coupled to the common node and a gate terminal of the first switch, and wherein the second device has a gate terminal coupled to a gate terminal of the second switch. In some embodiments, the comparator comprises: a first operational transconductance amplifier (OTA) coupled to the source terminal of the p-type transistor; and a second OTA coupled to the drain terminal of the drain terminal of the p-type transistor.

In another example, a system is provided which comprises: a memory; a processor coupled to the memory, the processing including: a body or substrate of a p-type transistor, the p-type transistor having a source terminal and a drain terminal which are to receive a source voltage and a drain voltage, respectively; and a sensor coupled to the source and drain terminals of the p-type transistor, wherein the sensor is to determine whether the source voltage and the drain voltage are different, and to provide a body voltage to the body or substrate of the p-type transistor according to a larger of the source or drain voltages; and a wireless interface for allowing the processor to communicate with another device. In some embodiments, the sensor has a bandwidth which is proportional to a difference between the source and drain voltages.

In some embodiments, the sensor comprises: a first switch coupled to the source terminal of the p-type transistor; and a second switch coupled in series with the first switch via a common node, wherein the second switch is coupled to the drain terminal of the p-type transistor, wherein the common node is coupled to the body or substrate of the p-type transistor. In some embodiments, the sensor comprises a first device coupled to the common node and a gate terminal of the second switch, and wherein the first device has a gate terminal coupled to a gate terminal of the first switch.

In some embodiments, the sensor comprises a second device coupled to the common node and a gate terminal of the first switch, and wherein the second device has a gate terminal coupled to a gate terminal of the second switch. In some embodiments, the sensor comprises a first operational transconductance amplifier (OTA) coupled to the source terminal of the p-type transistor. In some embodiments, the sensor comprises a second OTA coupled to the drain terminal of the drain terminal of the p-type transistor. In some embodiments, the p-type transistor is a bi-directional switch.

In another example, a method is provided which comprises: comparing a first voltage on a first node with a second voltage on a second node; and providing one of a larger one of the first voltage and the second voltage as a body potential for a p-type transistor, wherein the first node and the second nodes are coupled to the p-type transistor. In some embodiments, providing one of the larger one of the first and second voltages comprises: turning on one of a select transistor, from among two select transistors, which is coupled to one of the first or second nodes which has a larger one of the first and second voltages. In some embodiments, turning off one of the select transistors which is not selected to be turned on. In some embodiments, the method comprises turning off one of the select transistors which is coupled to one of the first or second nodes which has the lower of the first and second voltages.

In another example, an apparatus is provided which comprises: means for comparing a first voltage on a first node with a second voltage on a second node; and means for providing one of a larger one of the first voltage and the second voltage as a body potential for a p-type transistor, wherein the first node and the second nodes are coupled to the p-type transistor. In some embodiments, the means for providing one of the larger one of the first and second voltages comprises: means for turning on one of a select transistor, from among two select transistors, which is coupled to one of the first or second nodes which has a larger one of the first and second voltages. In some embodiments, the apparatus comprises means for turning off one of the select transistors which is not selected to be turned on. In some embodiments, the apparatus comprises means for turning off one of the select transistors which is coupled to one of the first or second nodes which has the lower of the first and second voltages.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a body or substrate of a p-type transistor, the p-type transistor having a source terminal and a drain terminal which are to receive a source voltage and a drain voltage, respectively; and
    a sensor coupled to the source and drain terminals of the p-type transistor, wherein the sensor is to determine whether the source voltage and the drain voltage are different, and to provide a body voltage to the body or substrate of the p-type transistor according to a larger of the source or drain voltages.

2. The apparatus of claim 1, wherein the sensor has a bandwidth which is proportional to a difference between the source and drain voltages.

3. The apparatus of claim 1, wherein the sensor comprises:
    a first switch coupled to the source terminal of the p-type transistor; and a second switch coupled in series with the first switch via a common node, wherein the second switch is coupled to the drain terminal of the p-type transistor, wherein the common node is coupled to the body or substrate of the p-type transistor.

4. The apparatus of claim 3, wherein the sensor comprises a first device coupled to the common node and a gate terminal of the second switch, and wherein the first device has a gate terminal coupled to a gate terminal of the first switch.

5. The apparatus of claim 4, wherein the sensor comprises a second device coupled to the common node and a gate terminal of the first switch, and wherein the second device has a gate terminal coupled to a gate terminal of the second switch.

6. The apparatus of claim 3, wherein the sensor comprises a first operational transconductance amplifier (OTA) coupled to the source terminal of the p-type transistor.

7. The apparatus of claim 6, wherein the sensor comprises a second OTA coupled to the drain terminal of the drain terminal of the p-type transistor.

8. The apparatus of claim 1, wherein the p-type transistor is a bi-directional switch.

9. An apparatus comprising:
a bi-directional switch; and
a comparator coupled to the bi-directional switch, the comparator having:
a first input coupled to a first terminal of the bi-directional switch;
a second input coupled to a second terminal of the bi-directional switch; and
an output coupled to a body or substrate of the bi-directional switch.

10. The apparatus of claim 9, wherein the comparator has a bandwidth which is proportional to a difference between a voltage on the first input and a voltage on the second input.

11. The apparatus of claim 9, wherein the bi-directional switch is a p-type transistor.

12. The apparatus of claim 9, wherein the comparator is to determine whether a first voltage on the first input and a second voltage on the second input are different, and to provide a body voltage to the body or substrate of the bi-directional switch according to a larger of the first or second voltages.

13. The apparatus of claim 9, wherein the comparator comprises:
a first switch coupled to the first terminal of the bi-directional switch; and
a second switch coupled in series with the first switch via a common node, wherein the second switch is coupled to the second terminal of the bi-directional switch, wherein the common node is coupled to the body or substrate of the bi-directional switch.

14. The apparatus of claim 13, wherein the comparator comprises a first device coupled to the common node and a gate terminal of the second switch, and wherein the first device has a gate terminal coupled to a gate terminal of the first switch.

15. The apparatus of claim 14, wherein the comparator comprises a second device coupled to the common node and a gate terminal of the first switch, and wherein the second device has a gate terminal coupled to a gate terminal of the second switch.

16. The apparatus of claim 15, wherein the comparator comprises a first operational transconductance amplifier (OTA) coupled to the source terminal of the p-type transistor.

17. The apparatus of claim 16, wherein the comparator comprises a second OTA coupled to the drain terminal of the drain terminal of the p-type transistor.

18. A system comprising:
a memory;
a processor coupled to the memory, the processor comprising:
a bi-directional switch; and
a comparator coupled to the bi-directional switch, the comparator having:
a first input coupled to a first terminal of the bi-directional switch;
a second input coupled to a second terminal of the bi-directional switch; and
an output coupled to a body or substrate of the bi-directional switch, wherein the comparator has a bandwidth which is proportional to a difference between a voltage on the first input and a voltage on the second input; and
a wireless interface for allowing the processor to communicate with another device.

19. The system of claim 17, wherein the comparator is to determine whether a first voltage on the first input and a second voltage on the second input are different, and to provide a body voltage to the body or substrate of the bi-directional switch according to a larger of the first or second voltages.

20. The system of claim 17, wherein the comparator comprises:
a first switch coupled to the first terminal of the bi-directional switch; and
a second switch coupled in series with the first switch via a common node, wherein the second switch is coupled to the second terminal of the -directional switch, and wherein the common node is coupled to the body or substrate of the -directional switch.

21. The system of claim 20, wherein the comparator comprises:
a first device coupled to the common node and a gate terminal of the second switch, and wherein the first device has a gate terminal coupled to a gate terminal of the first switch; and
a second device coupled to the common node and a gate terminal of the first switch, and wherein the second device has a gate terminal coupled to a gate terminal of the second switch.

22. The system of claim 21, wherein the comparator comprises:
a first operational transconductance amplifier (OTA) coupled to the source terminal of the p-type transistor; and
a second OTA coupled to the drain terminal of the drain terminal of the p-type transistor.

* * * * *